United States Patent [19]
Kaplinsky

[11] Patent Number: 5,164,612
[45] Date of Patent: Nov. 17, 1992

[54] PROGRAMMABLE CMOS FLIP-FLOP EMPTYING MULTIPLEXERS

[76] Inventor: Cecil H. Kaplinsky, 140 Melville Ave., Palo Alto, Calif. 94301

[21] Appl. No.: 869,616

[22] Filed: Apr. 16, 1992

[51] Int. Cl.⁵ .................. H03K 3/289; H03K 3/01
[52] U.S. Cl. .................. 307/272.2; 307/481; 307/270; 307/296.3; 307/243; 307/453
[58] Field of Search .............. 307/270, 480–481, 307/272.2, 296.3, 243, 453

[56] References Cited

U.S. PATENT DOCUMENTS

| | | | |
|---|---|---|---|
| 4,700,088 | 10/1987 | Tubbs | 307/453 |
| 5,115,150 | 5/1992 | Ludwig | 307/481 |

*Primary Examiner*—William L. Sikes
*Assistant Examiner*—Margaret Rose Wambach
*Attorney, Agent, or Firm*—Schneck & McHugh

[57] ABSTRACT

A CMOS flip-flop circuit that includes master and slave inverter latches, a pass transistor for opening and closing access of the master latch input to an input signal D, and a special driver circuit between the master and slave latches to pull the input of the slave latch either up or down depending on the logic level of the master latch output. The pass transistor and driver circuit are responsive to a control signal, supplied by complementary clock signals or by multiplexers that select either the clock signals or a fixed logic high signal, to activate a conductive path to the inputs of respective master and slave latches. The driver circuit includes four transistors connected, so that first and second transistors are in series and third and fourth transistors are in series, to form two parallel paths from two logic level sources to the slave latch input. First and third transistors are driven by the master latch output, while second and fourth transistors are driven by the control signal to the drive circuit. The two logic level sources connected to the first and third transistors may be fixed logic high and low voltage levels for conventional flip-flop operation or to multiplexers, each selecting either a logic high or a logic low voltage level, for programmable polarity of the flip-flop output. Placing latches enabled by the pass transistor control signal between the multiplexers and the first and third transistors and increasing the selection of the multiplexers to include complementary slave latch output feedback signals provides programmable D-type or toggle flip-flop operation. The multiplexer's nontoggle selection signal may be fixed or dynamically variable through a configuration multiplexer for dynamic polarity of the flip-flop's output.

9 Claims, 2 Drawing Sheets

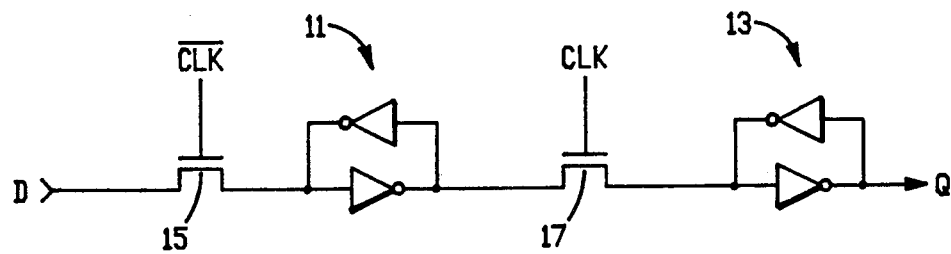
FIG.−1
(PRIOR ART)
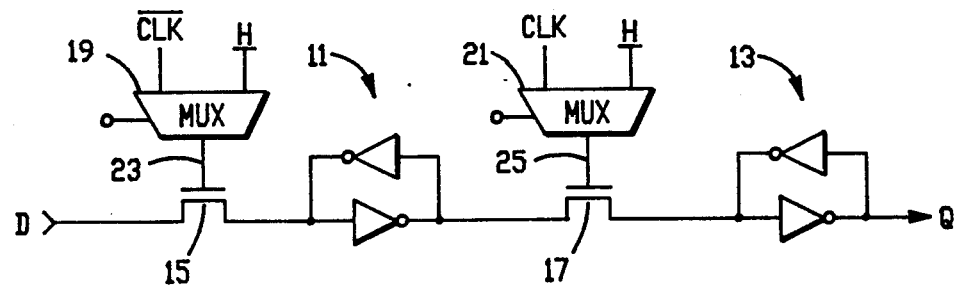
FIG.−2
(PRIOR ART)
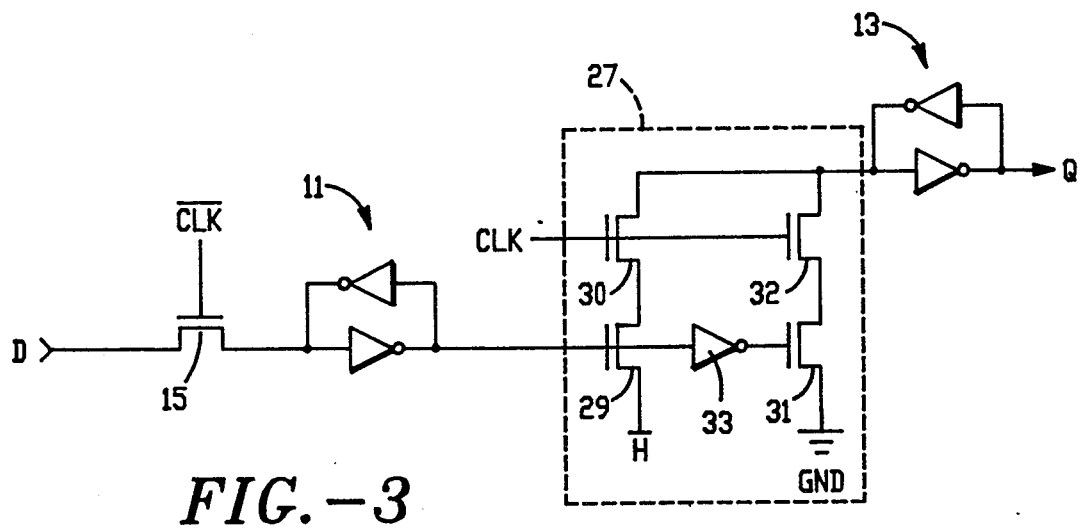
FIG.−3
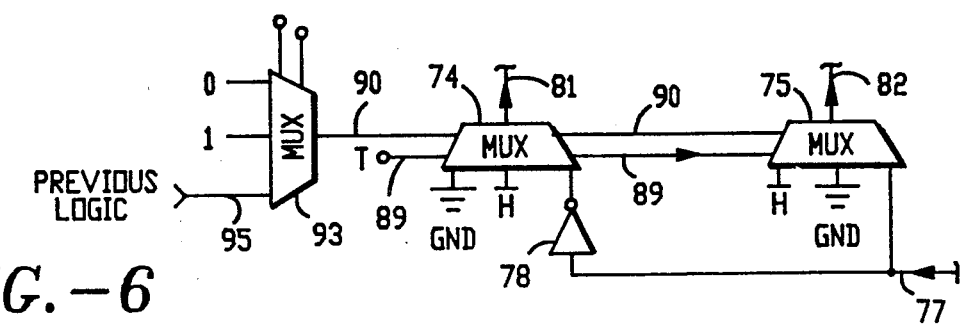
FIG.−6

PROGRAMMABLE CMOS FLIP-FLOP EMPTYING MULTIPLEXERS

DESCRIPTION

1. Technical Field

The present invention relates to solid-state digital logic circuits of the type employing complementary field-effect transistors (FETs), that is, CMOS logic circuits, and in particular to two-stage (master-slave) bistable multivibrators or flip-flops of the type employing a CMOS inverter latch in each flip-flop stage.

2. Background Art

Ordinary CMOS flip-flops, shown in FIG. 1, have a pair of inverter latches 11 and 13, respectively referred to as master and slave latches, which are opened and shut by a pair of complementary clock signals $\overline{CLK}$ and CLK applied to the gates of simple pass transistors 15 and 17. When $\overline{CLK}$ goes high and CLK goes low, the pass transistors 15 and 17 are respectively enabled and disabled, allowing an input signal D to be loaded into the master latch 11 and isolating the slave latch 13 from the master latch 11. When $\overline{CLK}$ goes low and CLK goes high, the pass transistors 15 and 17 are respectively disabled and enabled, isolating the master latch 11 from the signal input and allowing the complement or inverse of the signal previously loaded into the master latch 11 to be transferred to the slave latch 13. When the clock signals $\overline{CLK}$ and CLK again switch states, the slave latch 13 will again be isolated from the master latch 11, while the master latch 11 is loaded with a new input signal. The output signal Q provided by the slave latch 13 is determined by the input signal D that appeared one clock pulse earlier.

A common variation of this simple configuration, shown in FIG. 2, uses multiplexers 19 and 21 connected to the respective gate inputs 23 and 25 of one or both pass transistors 15 and 17 to select either the clock signal, respectively $\overline{CLK}$ and CLK, or a fixed logic high signal H. If both complementary clock signals $\overline{CLK}$ and CLK are selected by the multiplexers 19 and 21, then the circuit operates as a flip-flop, in the same manner as in FIG. 1. If one multiplexer 19 or 21 selects the fixed logic high signal H and applies it to one of the pass transistor gates 23 or 25, then the corresponding pass transistor 15 or 17 will remain open, allowing either loading of the master latch 11 or signal transferral to the slave latch 13 at all times, regardless of the state of the clock input $\overline{CLK}$ or CLK. Effectively, one of the latches becomes transparent, and the circuit operates as a single-stage latch. If both pass transistors 15 and 17 are selected by the multiplexers 19 and 21 to receive fixed logic high signals H, no latching can take place and the circuit becomes effectively transparent. The input signal D passes straight through to the output Q.

An object of the present invention is to provide CMOS flip-flops which are capable of being programmed to provide a selected or dynamically variable output polarity and either D-type or toggle flip-flop operation, in addition to the flip-flop, latch and transparent options already provided in conventional flip-flop circuits, without sacrificing operational speed.

DISCLOSURE OF INVENTION

The object has been met with a programmable CMOS flip-flop circuit that employs a special driver circuit between master and slave inverter latches of the flip-flop circuit to pull the input to the slave latch either up to a power supply potential or down to a ground potential, depending upon the logic level of the output from the master latch, and thereby load the slave latch with a value, high or low, that corresponds to the value of the input signal that was previously loaded into the master latch.

The driver circuit includes four n-channel MOS transistors and a CMOS inverter connected so that first and second transistors are in series, third and fourth transistors are in series, the gates of first and third transistors are driven by the master latch output directly and via the inverter, respectively, the gates of the second and fourth transistors are driven by a control signal, and source or drain terminals of the second and fourth transistors are both connected to the input of the slave latch. The control signal applied to the second and fourth transistor gates may be a multiplexer selected clock signal or fixed logic high signal, or alternatively, may be a clock signal received directly by the gates. Source or drain terminals of the first and third transistors are connected, in one embodiment, to a fixed logic high voltage (power supply voltage) and a fixed logic low voltage (ground voltage), respectively. Depending on the output of the master latch, a conductive path will exist from one of these fixed voltages to the slave latch either through the first and second transistors or through the third and fourth transistors.

In an alternate embodiment, both fixed logic voltages (high and low) are available to each of the first and third transistors, and a pair of driver multiplexers selects which voltage is coupled to which transistor, thereby providing programmable polarity control of the flip-flop's output. The multiplexer selections are responsive to selection signals, such as those produced by the programmed states of nonvolatile configuration memory bits.

In a third embodiment, a pair of driver latches are connected to the drain or source terminals of the first and third transistors and enabled by the same control signal that opens and shuts the master latch. The driver latches are loaded by the driver multiplexers, which in addition to the fixed logic high and low signal voltage level options provided in the second embodiment for polarity control, also provides the optional selection of respective inverted and noninverted signals fed back from the present flip-flop output. If the feedback signals are selected and loaded into the driver latches, then the flip-flop's output will toggle or switch to the opposite state whenever the flip-flop's input is in a first logic state, e.g. logic high, but will remain unchanged whenever the flip-flop's input is in a second logic state, e.g. logic low. This toggle flip-flop circuit is faster than conventional programmable toggle flip-flops because the signal does not need to feed through a two-stage arrangement of XOR gate and D-type flip-flop. The selection by the driver multiplexers can be controlled by nonvolatile configuration memory bits or can be controlled in part by an output of a configuration multiplexer that can select not only either of the fixed configuration bit states but also a dynamically changeable signal derived from previous logic.

BRIEF DESCRIPTION OF THE DRAWINGS

FIGS. 1 and 2 are schematic circuit diagrams of two prior art flip-flops.

FIGS. 3-5 are schematic circuit diagrams of three flip-flop embodiments of the present invention.

FIG. 6 is a schematic circuit diagram of an alternative circuit portion that can replace the portion within the dashed box 6 of FIG. 5 to form yet another flip-flop embodiment of the present invention.

BEST MODE OF CARRYING OUT THE INVENTION

Figure 4:
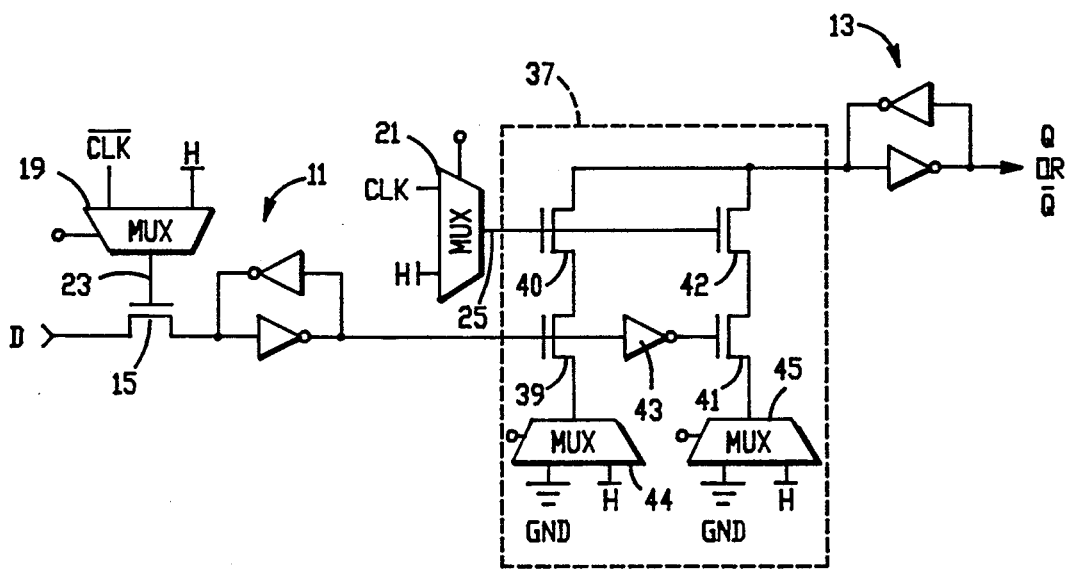

With reference to FIGS. 1 and 2, as previously mentioned, ordinary CMOS flip-flops of the prior art are generally two-stage circuits having a master latch 11 followed by a slave latch 13, which are opened and shut by pass transistors 15 and 17 that are responsive to control signals $\overline{CLK}$, CLK or H applied to their gates. Each of the inverter latches 11 and 13 includes a pair of CMOS inverters which are cross-coupled so that the output of one is connected to the input of the other. The control signals may be complementary clock signals $\overline{CLK}$ and CLK received directly by respective pass transistors 15 and 7, as in FIG. 1, or may be either these clock signals $\overline{CLK}$ and CLK or a fixed logic high signal H, as selected by multiplexers 19 and 21 in FIG. 2. Each of these elements, with the exception of the pass transistor 17 located between the master and slave latches 11 and 13, is also found in the flip-flop circuits of the present invention, shown in FIGS. 3-5.

Figure 5:
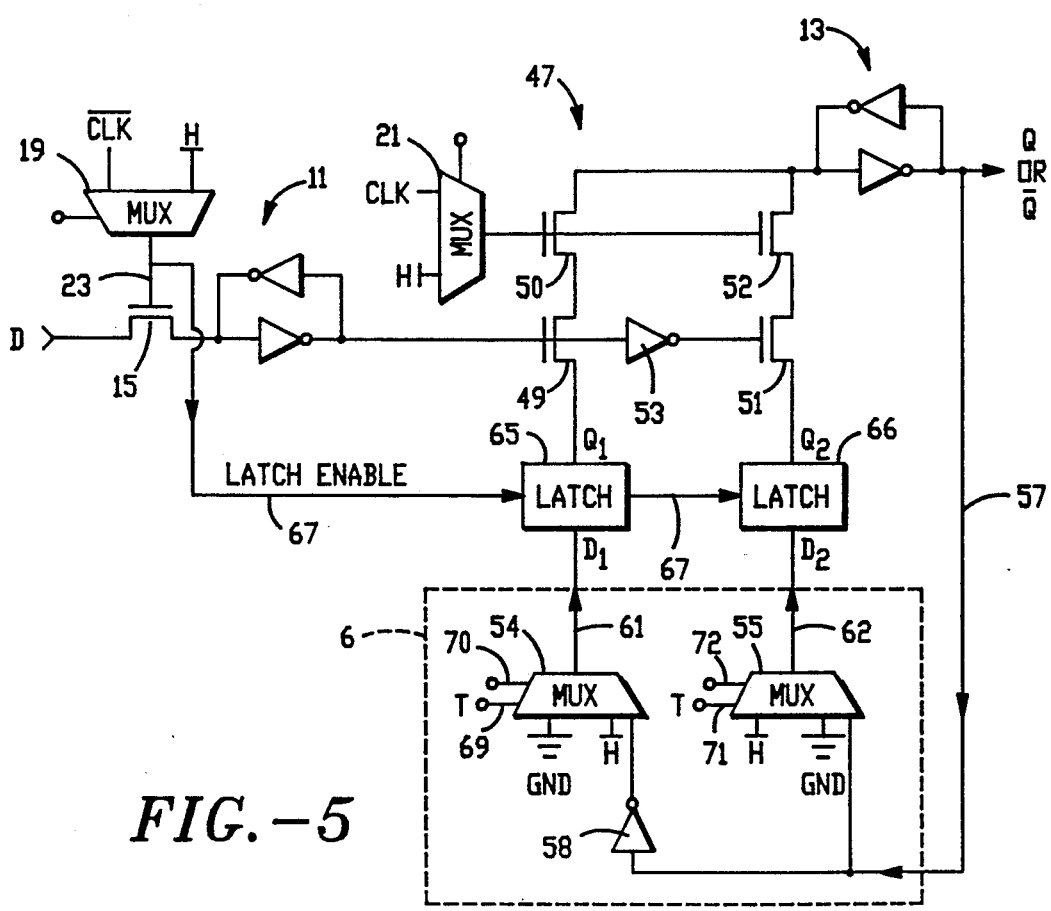

In flip-flop circuits of the present invention, a special driver circuit 27, seen in its most basic form in FIG. 3, replaces the simple pass transistor 17 of conventional flip-flops. Though the special driver circuit 27 performs essentially the same function as the pass transistor 17, causing or preventing transfer of the signal output from the master latch 11 into the slave inverter latch 13 in response to a received control signal, such as a clock signal CLK, the driver circuit 27 performs this function in a different way from the pass transistor 17. An advantage of the driver circuit 27 is that its basic structure can be modified as shown in FIGS. 4-6 to provide greater functional flexibility to the flip-flops of the present invention than could ever be done using the conventional pass transistor 17.

In FIG. 3, the special driver circuit 27 is seen to include four n-channel MOS transistors 29-32 and a CMOS inverter 33. It will be clear to those skilled in the art that the circuit could be easily modified to instead use p-channel MOS transistors or a combination of both p- and n-channel transistors, with appropriate reversals of the voltage levels applied to the gates of any p-channel transistors, such as by the addition (or removal) of CMOS inverters in the lines or signal paths, leading to those gates. A first transistor 29 has a drain connected to a power supply to receive a fixed voltage level, typically about 5V, corresponding to a logic high signal H, a source connected to a drain of a second transistor 30, and a gate directly connected to the output of master inverter latch 11. The second transistor 30 has its drain connected to the source of first transistor 29, a source connected to the input of slave inverter latch 13, and a gate connected to receive a clock signal CLK. A third transistor 31 has a source connected to a ground terminal, a drain connected to a source of a fourth transistor 32, and a gate coupled via the inverter 33 to the output of the master inverter latch. The fourth transistor 32 has its source connected to the drain of the third transistor 31, a drain connected to the input of the slave inverter latch 13, and a gate connected to receive the same clock signal CLK as second transistor 30.

In operation, when the complementary clock signals $\overline{CLK}$ and CLK become respectively high and low (typically, 5V and 0V), pass transistor 15 becomes conductive, allowing an input signal D to be loaded into master inverter latch 11. The second and fourth transistors 30 and 32 in the drive circuit 27, each receiving the clock signal CLK on their gates, both turn off, thereby isolating the slave inverter latch 13 from the master inverter latch 11. The signal level on the output side of master latch 11, which is the logical complement or inverse of the voltage level of input signal D loaded into the master latch 11, is prevented from being immediately transferred into the slave latch 13 by this isolation provided by transistors 30 and 32.

When the clock signals $\overline{CLK}$ and CLK become, in the next part of the clock cycle, logic low and high, respectively, pass transistor 15 turns off, thereby isolating the master inverter latch 11 from the input signal D. Accordingly, master latch 11 will retain the signal value loaded previously, even if the input signal D should change, until the clock signals again switch. The output of the master latch 11 drives the gates of first and third n-channel MOS transistors 29 and 31, the latter through inverter 33, causing one (and only one) of them to become conductive, and turning off the other transistor. Thus, when a logic low (0V) input signal D has been loaded into master latch 11, the logic high (5V) output from the master latch 11 couples via inverter 33 to third transistor 31, turning it off and isolating the slave latch 13 from the ground terminal GND. The master latch output also turns on the first transistor 29. Because the clock signal CLK is also high, second transistor 30 is also turned on, thereby providing a conductive path through transistors 29 and 30 from the power supply terminal H to the input to the slave latch 13. The power supply pulls up the voltage level on the slave latch input, loading the slave latch with a logic high signal value. The output Q of the slave latch 13 (and of the entire flip-flop circuit) is a logic low signal, i.e. the same logic level as the input signal D loaded into the master latch during the previous part of the clock cycle. Likewise, when the input signal D loaded into the master latch 11 is high, the logic low master latch output turns off the first transistor 29, isolating the slave latch 13 from the power supply terminal H, and through inverter 33, turns on the third transistor 31. The conductive path provided through the third and fourth transistors 31 and 32 pulls the input to the slave latch 13 down to the logic low ground voltage GND. The output Q of the flip-flop circuit is thus a logic high signal, again the same logic level as the previously loaded input signal D.

Thus, the driver circuit 27 couples either a fixed logic high signal H (power supply voltage) or a fixed logic low signal GND to the slave latch 13, depending on the output of the master latch, whenever the clock signal CLK is high. The flip-flop in FIG. 3 performs the same overall function as the flip-flop circuit in FIG. 1, but in a different way With reference to FIG. 4, a multiplexer 19 is connected to the gate 23 of pass transistor 15, and responsive to a selection signal provided in accord with the state of a user programmable control bit, stored, for example, a nonvolatile memory cell, selects either a clock input $\overline{CLK}$ or a fixed logic high signal H for application to said pass transistor 15. Likewise, a second multiplexer 21 is connected to the control input 25 of a driver circuit 37, specifically to the gates of second and fourth n-channel MOS transistors 40 and 42 of the driver circuit 37. The second multiplexer 25 is responsive to a state of another user programmable control bit so as to select either a clock input CLK or the fixed logic high signal H for application to the second and fourth transistors 40 and 42 of the driver circuit 37. As in the embodiment in FIG. 2, the additional multiplexers 19 and 21 cause the flip-flop circuit in FIG. 4 to operate as a two-stage flip-flop, like the flip-flop of FIG. 3, or as a one-stage latch, or to be effectively transparent to the input signal D, depending on the control signal selections made by the multiplexers 19 and 21. If both multiplexers 19 and 21 select application of the complementary clock signals $\overline{CLK}$ and CLK to respective inputs 23 and 25 of pass transistor 15 and driver circuit 37, then the circuit operates as a flip-flop. If one of the multiplexers 19 and 21 selects application of the fixed logic high signal H, then the corresponding master or slave latch 11 or 13 will not be isolated during any part of the clock cycle from the respective input signal D or master latch output, and will therefore be effectively transparent to the remainder of the flip-flop circuit. The circuit then operates as a single-stage latch. If both multiplexers 19 and 21 apply the logic high signal H to control inputs 23 and 25, both stages will be continually open, and the circuit will be transparent to the input signal D. Apart from minor signal propagation delays, the output signal Q will change with changes in the input signal D without regard for the clock.

The driver circuit 37 in FIG. 4 is a variation of the driver circuit 27 of FIG. 3 that permits programming of the polarity of the flip-flop's output Q or $\overline{Q}$. Like the driver circuit 27 of FIG. 3, the driver circuit 37 in FIG. 4 has four n-channel MOS transistors 39-42 and a CMOS inverter 43, connected together in the same manner as transistors 29-32 and inverter 33 in FIG. 3. In particular, a first transistor 39 has a source connected to a drain of a second transistor 40 and a gate directly connected to the output of master inverter latch 11. Second transistor 40 has a source connected to the input of the slave inverter latch 13 and a gate connected to the control input 25 to receive either the clock signal CLK or the fixed logic high signal H as selected by the multiplexer 21 A third transistor 41 has a drain connected to a source of a fourth transistor 42 and a gate coupled through the CMOS inverter 43 to the output of the master latch 11. The fourth transistor has a drain connected to the input of the slave latch 13 and a gate connected to the control input 25.

Unlike the driver circuit 27 of FIG. 3, however, the drain of first transistor 39 and the source of third transistor 41 in FIG. 4 are not directly connected to the power supply voltage H or the ground terminal GND, but rather are connected to third and fourth multiplexers 44 and 45. Each of these multiplexers 44 and 45 has two inputs connected, respectively, to the ground terminal GND and the power supply terminal H. Responsive to selection signals provided in accord with the user programmed state of nonvolatile memory control bits, the multiplexers 44 and 45 selectively apply one of these inputs to the first and third transistors 39 and 41.

If the third multiplexer 44 applies the fixed logic high signal H from the power supply to the drain of the first transistor 39, while fourth multiplexer 45 applies the fixed logic low signal GND from the ground terminal to the source of the third transistor 41, the connections are exactly like that in FIG. 3. Thus, whenever the second and fourth transistors 40 and 42 are conductive (fixed logic high signal H selected or clock signal CLK is high), a logic low output from master latch 11 will turn off first transistor 39 and turn on third transistor 41, providing a conductive path through transistors 42 and 41 and through multiplexer 45 from slave latch 13 to ground GND, pulling down the input to the slave latch 13 and loading the logic low output from master latch 11 into the slave latch 13. Similarly, a logic high output from master latch 11 will turn off third transistor 41 and turn on first transistor 39, providing a conductive path through multiplexer 44 and transistors 39 and 40 from the power supply H to the input to slave latch 13, causing that input to be pulled up and a logic high signal value to be loaded into slave latch 13. The flip-flop output Q is then reinverted by the slave latch 11 and, thus, compared to the input signal D is noninverted.

Reversing the selections by the multiplexers 44 and 45, so that a logic low signal GND from the ground terminal is applied to first transistor 39 and a logic high signal H from the power supply is applied to third transistor 41 causes the effect of a conductive path to the slave inverter latch 13 to be reversed. When a conductive path is provided through multiplexer 45 and transistors 41 and 42, namely when the output from master latch 11 is logic low, the slave latch 13 is coupled to the power supply and its input is pulled up by the logic high voltage H, instead of being pulled down by the ground voltage GND. Similarly, when a conductive path is provided through transistors 40 and 39 and through multiplexer 44, namely when the master latch output is logic high, the input to the slave latch is pulled down by the logic low voltage level GND of the selected ground terminal, instead of being pulled up by the power supply. The flip-flop output $\overline{Q}$ is inverted compared to the input signal D loaded into master latch 11 Thus, the replacement of the fixed logic high signal H and the fixed logic low signal GND in the slave latch's input driver 27 of FIG. 3 with selectable logic high and low signals H and GND in the driver 37 of FIG. 4, allows the polarity of the flip-flop's output Q or $\overline{Q}$, as compared to the input signal D loaded into the flip-flop, to be programmable.

If the driver multiplexers 44 and 45 are both configured to select the ground terminal GND or both configured to select the logic high signal H of the power supply, the flip-flop output signal Q will be a constant logic high value or a constant logic low value, regardless of the input signal D.

With reference to FIG. 5, yet another flip-flop configuration functions as a programmable D or toggle flip-flop. The circuit includes a master inverter latch 11 and a slave inverter latch 13. A pass transistor 15 is connected to the input of the master latch 11 and is also connected to receive an input signal D and to load this signal D into the master latch 11 in response to a control signal $\overline{CLK}$ or H applied by a multiplexer 19 to the gate input 23 of pass transistor 15. The multiplexer 19 selects, in response to a selection signal provided by a nonvolatile configuration bit, either a clock signal $\overline{CLK}$ or a fixed logic high signal H to be applied to the pass transistor's gate 23. The circuit also includes a driver circuit 47, which is a further modification of the driver circuit 37, that connects the master inverter latch 11 to the slave inverter latch 13. The driver circuit 47 includes four n-channel MOS transistors 49-52 and a CMOS inverter 53 configured like the components 29-33 and 39-43 in FIGS. 3 and 4. The output of the master inverter latch 11 drives the first transistor 49 directly and the third transistor 51 via the inverter 53. A control signal, such as a clock signal CLK or a fixed logic high signal H, selected by a multiplexer 21 drives the second and fourth transistors 50 and 52. When the control signal is high, a conductive path exists through either the first and second transistors 49 and 50 or the third and fourth transistors 51 and 52 to the input of the slave latch 13, depending upon whether the output of master latch 11 is logic high or low, respectively. The structure of the FIG. 5 flip-flop circuit described so far is the same as the structure in FIG. 4.

Driver multiplexers 54 and 55 receive, not only fixed logic low and fixed logic high signals GND and H, but also the dynamic output signal from slave inverter latch 13 via feedback line 57 and inverter 58. Multiplexer 54 receives the inverted or complementary form of the slave latch output via inverter 58, while multiplexer receives the noninverted form of the slave latch output directly from feedback line 57. The driver multiplexers 54 and 55 are responsive to selection control signals on inputs 69–72 from nonvolatile configuration bits. Each driver multiplexer 54 and 55 has two control inputs for selecting one of the three inputs, namely fixed logic high signal H, fixed logic low signal GND and a feedback signal, inverted or noninverted from the output of the slave latch 13. Preferably, one of the control inputs 69 or 71 is dedicated to selecting or deselecting toggle flip-flop operation in response to the state of the configuration bit or bits, labelled T in FIG. 5. The other of the control inputs 70 or 72 is then dedicated to selecting the output polarity of the flip-flop in the D flip-flop mode of operation.

The signals selected by multiplexers 54 and 55 are coupled to outputs 61 and 62 of multiplexers 54 and 55 and applied to data inputs $D_1$ and $D_2$ of respective driver latches 65 and 66. The outputs $Q_1$ and $Q_2$ of latches 65 and 66 connect to source/drain terminals of first and third transistors 49 and 51. Both latches 65 and 66 are enabled by a latch enable signal on control line 67 from the output of multiplexer 19, the same signal as that which opens and shuts the master latch 11. The latches 65 and 66 may be pass-transistor-gated inverter latches, configured just like the pass transistor 15 and master inverter latch 11, but with the addition of an inverter at the latch output to match the polarity of the loaded input $D_1$ or $D_2$ with the latch output $Q_1$ or $Q_2$.

In operation, if the toggle configuration bits T are programmed to a state that deselects toggle flip-flop operation, then either the fixed logic low signal GND or the fixed logic high signal H is selected by multiplexers 54 and 55. The inputs $D_1$ and $D_2$ to driver latches 65 and 66 are constant, and the outputs $Q_1$ and $Q_2$ of the driver latches 65 and 66 applied to the first and third transistors 49 and 51, respectively, always have the same fixed logic level as the signals GND or H selected by the multiplexers 54 and 55. The circuit is then equivalent to the embodiment shown in FIG. 4, since the driver latches 65 and 66 are effectively transparent.

Consider now the case in which the toggle configuration bits T are programmed to the state that selects toggle flip-flop operation. Assume first that the input signal D is low. During the first part of the clock cycle, when the clock signals $\overline{CLK}$ and CLK are respectively high and low, the input signal D is loaded into the master inverter latch 11. Further, output Q of the slave inverter latch 13 and its complement $\overline{Q}$ are selected by driver multiplexers 55 and 54 and loaded into driver latches 66 and 65 at respective inputs $D_2$ and $D_1$. During the next part of the clock cycle, when the clock signals $\overline{CLK}$ and CLK have reversed states to low and high, respectively, second and fourth transistors 50 and 52 are turned on, opening up a conductive path to the input of the slave latch 13. In particular, the output of the master latch is high, turning on the first transistor 49. The value of the output $Q_1$ of driver latch 65, which is the complement $\overline{Q}$ of the slave latch's output Q previously loaded into driver latch 65, is loaded into the slave latch 13. The output of the slave inverter latch 13 is the complement Q of the signal $\overline{Q}$ that was loaded at its input, so the flip-flop's output Q remains unchanged.

In contrast, if the input signal D, loaded into the master latch 11 during the first part of the clock cycle, is high. The logic low output of the master latch 11 will turn on the third transistor 51 via inverter 53 during the second part of the clock cycle, so that a conductive path will exist through transistors 51 and 52 from the second driver latch 66 to the slave inverter's input. The value of the output $Q_2$ of driver latch 66, which is the same as the present output Q of the slave latch 13, will be loaded into the slave latch 13, inverting its output. Thus, if the input signal D is low, the flip-flop's output Q will remain unchanged, but if the input signal D is high, the output Q will toggle or switch to the opposite state. Toggling on a low input signal D can be accomplished in flip-flop circuits that position the inverter 58 at an input to second driver multiplexer 55, or that use driver latches 65 and 66 that provide outputs $Q_1$ and $Q_2$ which are the logical complement or inverse of respective latch inputs $D_1$ and $D_2$. The toggle condition could also be made programmable by providing two feedback inputs to each driver multiplexer 54 and 55, one inverted and one noninverted.

With reference to FIG. 6, a variation of the flip-flop circuit in FIG. 5 allows the selections by the driver multiplexers, here labelled 74 and 75, to be dynamically changeable, instead of being programmed by nonvolatile configuration memory bits. Driver multiplexers 74 and 75 receive a fixed logic low input signal GND from a ground terminal, a fixed logic high input signal H from a power supply terminal, and inverted and noninverted forms of a feedback signal from the output of a slave latch 13 via feedback line 77 and inverter 78. The outputs 81 and 82 from driver multiplexers 74 and 75 feed into driver latches 65 and 66, as in FIG. 5. Selection by the multiplexers 74 and 75 are responsive to control signals on common control input lines 89 and 90. Control line 89 supplies a toggle selection signal from a configuration bit T. For example, a logic low state for toggle configuration bit T might cause multiplexers 74 and 75 to select respective fixed input signals GND and H, while a logic high state for bit T might cause multiplexers 74 and 75 to select the feedback signals from feedback line 77 and inverter 78. If the fixed input signals GND and H are selected, the other control input line 90 determines the polarity of the selection. For example, a logic low input signal on control line 90 might cause multiplexer 74 to select the fixed logic low signal GND and apply it on output 81 to a first driver latch 65, while the same signal might also cause the second driver multiplexer 75 to select the fixed logic high signal H and apply that signal on its output 82 to a second driver latch 66. A logic high input signal on control line 90 might then cause multiplexers 74 and 75 to select fixed logic high and low signals H and GND, respectively. As previously noted above for FIGS. 4 and 5, such a selection of fixed signals controls the polarity of the output Q or $\overline{Q}$ of the flip-flop relative to the input signal D loaded into the flip-flop.

In FIG. 6, a configuration multiplexer 93 provides the selection signal to control line 90. Responsive to a pair of nonvolatile configuration memory bits on control inputs, the configuration multiplexer 93 selects either a logic low signal 0 or a logic high signal 1 or a dynamically variable signal on input 95 of the multiplexer 93 to be applied to its output 90, and thus to the nontoggle selection inputs of driver multiplexers 74 and 75. The dynamically variable signal actively controls the polarity of the output Q or $\overline{Q}$ of the flip-flop, inverting or not inverting the output depending on whether the variable signal is high or low. The dynamically variable signal may be derived from some other logic circuit, such as the output $Q_j$ of another flip-flop in a previous logic stage. For example, this would be useful in implementing a carry in arithmetic adders. Further, any of the other multiplexers in the flip-flop circuits of the present invention may be responsive to selection signals that are dynamically variable.

What is claimed is:

1. A flip-flop comprising
   a master inverter latch having an input and an output,
   a slave inverter latch having an input and an output, said output of said slave inverter latch being the output of the flip-flop,
   a pass transistor connected between an input of the flip-flop and said input of said master inverter latch, said pass transistor responsive to a first control signal applied to a gate of said pass transistor to block transfer of an input signal to said master inverter latch whenever said first control signal is at a first logic level and to permit transfer of said input signal to said master inverter latch whenever said first control signal is at a second logic level, and
   a driver circuit connected between said output of said master inverter latch and said input of said slave inverter latch, said driver circuit including first and second transistors connected in series between a first terminal input and said input of said slave inverter latch, and third and fourth transistors connected in series between a second terminal input and said input of said slave inverter latch, a gate of said first transistor connected directly to said output of said master inverter latch, a gate of said third transistor connected through an inverter to said output of said master inverter latch, gates of said second and fourth transistors connected to a control input of said driver circuits for receiving a second control signal,
   wherein each of said first and second terminal inputs of said driver circuit is connected to an output of a driver multiplexer, each driver multiplexer having a pair of drive inputs connected to receive fixed logic high and low voltages, respectively, and each driver multiplexer responsive to a polarity selection signal to select one of said voltages on said first and second drive inputs to be coupled to said output thereof.

2. The flip-flop of claim 1 wherein said master and slave inverter latches each comprise a pair of CMOS inverters cross-coupled to one another such that an output of each inverter is connected to an input of the other inverter.

3. The flip-flop of claim 1, wherein said first and second control signals are complementary clock signals.

4. The flip-flop of claim 1 further comprising a pair of multiplexers, each having an output respectively connected to said gate of said pass transistor and said control input of said driver circuit, each latch control multiplexer also having a first selectable input receiving a fixed logic high signal and a second selectable input respectively receiving complementary clock signals, and each latch control multiplexer responsive to a latch operation selection signal to select one of said first and second selectable inputs to be coupled to said output thereof.

5. The flip-flop of claim 4 wherein said latch operation selection signal for each latch control multiplexer is provided by a configuration memory bit in accord with a programmed state of said bit.

6. The flip-flop of claim 1 wherein said polarity selection signal is provided by a configuration memory bit in accord with a programmed state of said bit.

7. A flip-flop comprising
   a master inverter latch having an input and an output,
   a slave inverter latch having an input and an output, said output of said slave inverter latch being the output of the flip-flop,
   a pass transistor connected between an input of the flip-flop and said input of said master inverter latch, said pass transistor responsive to a first control signal applied to a gate of said pass transistor to block transfer of an input signal to said master inverter latch whenever said first control signal is at a first logic level and to permit transfer of said input signal to said master inverter latch whenever said first control signal is at a second logic level, and
   a driver circuit connected between said output of said master inverter latch and said input of said slave inverter latch, said driver circuit including first and second transistors connected in series between a first terminal input and said input of said slave inverter latch, and third and fourth transistors connected in series between a second terminal input and said input of said slave inverter latch, a gate of said first transistor connected directly to said output of said master inverter latch, a gate of said third transistor connected through an inverter to said output of said master inverter latch, gates of said second and fourth transistors connected to a control input of said driver circuits for receiving a second control signal,
   wherein each of said first and second terminal inputs of said driver circuit is connected to an output of a driver latch, both of said driver latches enabled by said first control signal, each driver latch having an input connected to an output of a corresponding driver mutliplexer, each driver multiplexer having a pair of inputs connected to receive fixed logic high and low voltages, respectively, and each driver multiplexer further having a third input connected indirectly through an inverter and directly to a feedback line, respectively, to receive respective inverted and noninverted forms of an output signal from said slave inverter latch, each multiplexer responsive to a pair of configuration selection signals to select one of said inputs to be coupled to said output thereof.

8. The flip-flop of claim 7 wherein said configuration selection signals are provided by nonvolatile configuration memory bits.

9. The flip-flop of claim 3 wherein said configuration selection signals are provided by one nonvolatile configuration memory bit for selecting said third inputs of said driver multiplexers and an output of a configuration multiplexer for selecting one of said first and second inputs of said driver multiplexers, said configuration multiplexer receiving a pair of fixed logic level inputs and a dynamically variable logic level input and selecting one of said inputs for application on said output thereof.

* * * * *

UNITED STATES PATENT AND TRADEMARK OFFICE
CERTIFICATE OF CORRECTION

PATENT NO. : 5,164,612  Page 1 of 2
DATED : November 17, 1992
INVENTOR(S) : Cecil H. Kaplinsky It is certified that error appears in the above-indentified patent and that said Letters Patent is hereby corrected as shown below:

On title page,

In the Title [54]: "PROGRAMMABLE CMOS FLIP-FLOP EMPTYING MULTI-PLEXERS" should read - - PROGRAMMABLE CMOS FLIP-FLOP EMPLOYING MULTIPLEXERS - -.

In the Abstract [57]: second column, line 13, "drive circuit" should read - - driver circuit - -.

Column 1, the title "PROGRAMMABLE CMOS FLIP-FLOP EMPTYING MULTI-PLEXERS" should read - - PROGRAMMABLE CMOS FLIP-FLOP EMPLOYING MULTIPLEXERS - -.

Column 3, line 19, "transistors 15 and 7" should read
 - - transistors 15 and 17 - -.

Column 4, line 56, "a different way" should read - - a different way. - -.

Column 4, line 61, "a nonvolatile memory cell" should read
 - - in a nonvolatile memory cell - -.

Column 5, lines 40-41, "multiplexer 21 A third transistor 41" should read - - multiplexer 21. A third transistor 41 - -.

Column 7, lines 14-15, "multiplexer receives" should read
 - - multiplexer 55 receives - -.

Column 7, line 32, "data inputs D and $D_2$" should read
 - - data inputs $D_1$ and $D_2$ - -.

UNITED STATES PATENT AND TRADEMARK OFFICE
CERTIFICATE OF CORRECTION

PATENT NO.  : 5,164,612
DATED       : November 17, 1992
INVENTOR(S) : Cecil H. Kaplinsky It is certified that error appears in the above-indentified patent and that said Letters Patent is hereby corrected as shown below:

Claim 3, column 9, line 65, "claim 1, wherein" should read -- claim 1 wherein --.

Claim 7, column 10, line 52, "driver mutliplexer," should read -- driver multiplexer, --.

Claim 9, column 10, line 66, "The flip-flop of claim 3" should read -- The flip-flop of claim 7 --.

Signed and Sealed this

Twenty-second Day of March, 1994

Attest:

BRUCE LEHMAN

Attesting Officer   Commissioner of Patents and Trademarks